United States Patent [19]

Gardiner et al.

[11] 4,394,406
[45] Jul. 19, 1983

[54] DOUBLE POLYSILICON CONTACT STRUCTURE AND PROCESS

[75] Inventors: James R. Gardiner, Wappingers Falls; Stanley R. Makarewicz, New Windsor; Martin Revitz, Poughkeepsie; Joseph F. Shepard, Hopewell Junction, all of N.Y.

[73] Assignee: International Business Machines Corp., Armonk, N.Y.

[21] Appl. No.: 164,647

[22] Filed: Jun. 30, 1980

[51] Int. Cl.³ .............................................. H01L 21/36
[52] U.S. Cl. ...................................... 427/86; 427/89; 427/94; 156/644; 156/653; 156/657
[58] Field of Search .................. 427/86, 94, 89, 126.4, 427/88; 156/656, 657, 653, 644, 662

[56] References Cited

U.S. PATENT DOCUMENTS 3,479,237 11/1969 Bersh et al. .............................. 427/94
4,251,571 2/1982 Garbarino et al. .................... 427/89

OTHER PUBLICATIONS

Bassous et al., "Method of Fabricating High-Performance IGFET Structures with Highly Controllable Submicron Effective Channel Lengths", IBM Tech. Disclosure Bulletin, vol. 21, No. 12, May 1979, pp. 5035-5038.

Revitz et al., "A Failure Mechanism in Silicon Gate Structures," Electrochemical Society Meeting, Los Angeles, Calif., Oct. 14-19, 1979, pp. 1427-1428.

Primary Examiner—John D. Smith
Assistant Examiner—Bernard F. Plantz
Attorney, Agent, or Firm—Wesley DeBruin

[57] ABSTRACT

A contact structure in a double polysilicon device is described in which direct shorts between overlying polysilicon conductors due to a "polysilicon void phenomenon" is overcome by patterning an appropriate etch stop between the conductors.

1 Claim, 9 Drawing Figures

DOUBLE POLYSILICON CONTACT STRUCTURE AND PROCESS

TECHNICAL FIELD

This invention relates to semiconductor devices and processes for manufacture thereof. More particularly, the invention relates to improved contact structures in double polysilicon devices and processes suitable for fabricating such contact structures in very large scale integration.

BACKGROUND ART

Double polysilicon technology, as described for example in U.S. Pat. No. 3,984,822, is particularly suitable for high density random access memory (RAM) and charge controlled devices (CCD). These devices are the major elements in memories for data processing systems. Increased device densities can be obtained in RAMs and CCDs by placing a contact to the second polysilicon conductor directly over the first polysilicon conductor. Such a contact placement, however, may be impacted by a "polysilicon void phenomenon". Laboratory experience indicates that polysilicon layers become porous due to grain growth and restructuring occurs during subsequent high temperature processes. Voids occur in the polycrystalline structure during the restructuring and may impact a contact structure, as will now be described.

When a protective insulating layer on overlying polysilicon conductors is etched to form contact openings, the etchant, typically hydrofluoric acid, in many instances, passes through a void in the restructured polycrystalline conductor to reach and etch through the insulating layer, typically silicon dioxide, separating the first polysilicon layer (poly 1) from the second polysilicon layer (poly 2). A direct short is formed between the first and second polysilicon layers when the contact opening is filled with a metal material. These poly 1 to poly 2 shorts lower the yields in RAMs and CCDs which increases device costs. Also, the poly 1 to poly 2 shorts require the circuit layout to be altered to lessen the shorts. These revised layouts require increased chip area to permit contacts to be formed in the poly 2 layer which are not directly over the poly 1 layer.

In the prior art, a similar phenomenon is described in U.S. Pat. No. 3,844,831 issued Oct. 29, 1974 and assigned to the present assignee. U.S. Pat. No. 3,844,831 describes a "tunneling phenomenon" in a multilevel metallurgy system for semiconductor devices. The "tunneling phenomenon" arises due to a misalignment between a contact opening or via and the metal levels to be connected together. When misalignment occurs, which frequently happens, the etchant tunnels through the exposed area including the common dielectric between the metallurgies as well as the dielectric separating the lower metallurgy from the semiconductor substrate. When the misaligned contact opening is filled with metal, a direct short is made to the semiconductor substrate by both metal layers. U.S. Pat. No. 3,844,831 solves the problem by forming a different dielectric between the lower level metallurgy and the substrate than the dielectric between the upper and lower metal levels. Essentially, the different dielectric is an etch stop to the etchant forming the contact opening to permit the joining together of the upper and lower metal levels but not the substrate with the metal levels. The problem of polysilicon void "phenomenon" is not addressed in U.S. Pat. No. 3,844,831 because the conductors are metal and not polysilicon. Further, the contact opening problem in double polysilicon exists whether or not misalignment occurs because the "polysilicon void phenomenon" exists in the polysilicon conductors and not in the insulating layers.

THE INVENTION

The present invention solves the problem of the prior art by an improved contact structure and process for forming the contact structure. The problem is solved by forming an etch stop between the polysilicon conductors and not between the lower conductor and the semiconductor substrate, as in the prior art. Moroever, the etch stop is self-aligned with respect to the contact opening, thereby limiting the effect of the etch stop in fabricating other portions of the device structure. Preferably, the etch stop is formed between the upper polysilicon conductor and the insulating layer separating the upper and lower polysilicon conductors.

The etch stop can be readily self-aligned with the contact opening by patterning the etch stop material prior to the formation of the second polysilicon conductor.

In one form, a preferred contact structure for double polysilicon devices includes a semiconductor substrate on which a first polysilicon conductor is patterned on an insulating film taken from the group consisting of thermally grown silicon dioxide, pyrolytically deposited silicon dioxide and chemically vapor deposited silicon dioxide. A second similar insulating film overlies the first polysilicon conductor. A third insulating layer overlies the second insulator but is a different dielectric material taken from the group consisting of silicon nitride and aluminum oxide, or the like, where contact openings are to be made in a second polysilicon layer overlying the first polysilicon conductor. The second polysilicon conductor overlying the first polysilicon conductor includes a fourth protective insulating layer. A contact opening is formed through the fourth insulating layer to the second polysilicon conductor. The contact opening is filled with a conductive material, typically aluminum, or the like. The silicon nitride or the like etch-stop prevents the etchant used for contact opening from penetrating through the second polysilicon layer, where voids exist, thereby preventing attack of the second insulator film. The avoidance of this attack prevents the aluminum contact metallurgy from shorting the second polysilicon conductor to the first polysilicon conductor.

The process for forming the improved contact structure includes selectively placing a thin etch stop, typically a silicon nitride barrier layer of approximately 500 Å between the inter-level oxide and the second polysilicon layer. The etch stop is self-aligned to the first polysilicon layer. This is readily accomplished by depositing the thin nitride film on the thicker inter-level oxide and duplicating the subsequent polysilicon delineation pattern in the nitride layer. The resulting structure will prevent etching the inter-level insulating layer due to the presence of polysilicon voids and the subsequent poly 1 to poly 2 shorts after the contact opening is metallized.

The use of nitride layer, suitably patterned between a polysilicon conductor and an insulating layer, is a well-known gate structure, as shown for example, in IBM Technical Disclosure Bulletin of March 1972, entitled "Self-Aligning Metal to Polysilicon Contacts", page 3176. Obviously, the gate structure described in the previously mentioned IBM Technical Disclosure Bulletin does not suggest the problem or provide the improved double polysilicon contact structure of the present invention.

A feature of the invention is a contact structure in a double polysilicon device which overcomes the "polysilicon void phenomenon" in causing direct shorts between overlying polysilicon conductors when a contact opening to the upper polysilicon conductor is filled with a metal.

Another feature of the invention is a self-aligned etchant barrier between overlying polysilicon conductors, the barrier preventing etchant from penetrating polysilicon voids in the upper polysilicon conductor and exposing the underlying polysilicon conductor.

Still another feature is a double polysilicon process for contact formation that includes forming a patterned silicon nitride film on an inter-level insulating member at preselected locations where contact openings are to be made in an overlying polysilicon conductor.

BRIEF DESCRIPTION OF DRAWINGS

Details of the present invention will be described in connection with the accompanying drawings, in which.

BEST MODE FOR CARRYING OUT THE INVENTION

Figure 1:
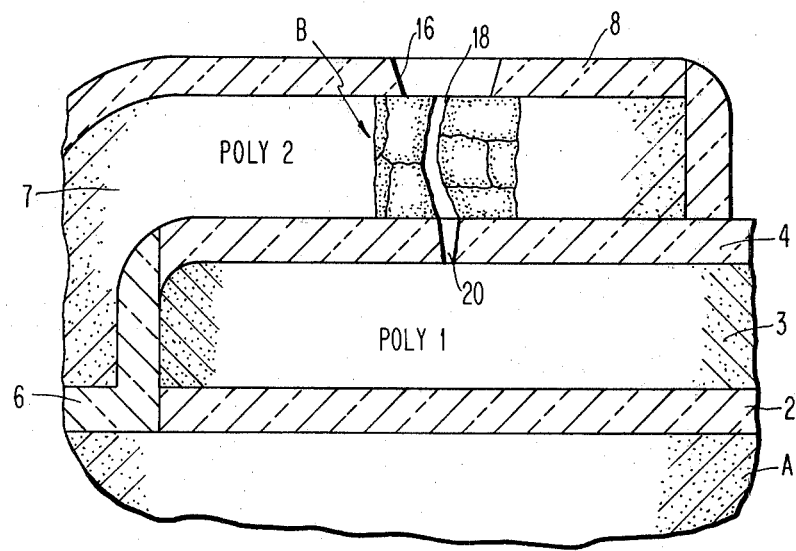
FIG. 1 is a cross-sectional view of a prior art double polysilicon semiconductor device having a polysilicon void which has permitted an opening to be made in an inter-level insulating layer whereby an electrical short is formed between the polysilicon conductors when the contact opening is filled with a metal.

Referring to FIG. 1, a typical prior art device includes a substrate A and insulating layer 2, typically silicon dioxide. A first polysilicon conductor is enclosed by a second silicon dioxide insulating layer 4. A second polysilicon conductor 7 overlies the first polysilicon layer 3. The layer 7 is also enclosed by a silicon dioxide insulating layer 8. In FIG. 1, the polysilicon layer 7 is enlarged at section B to show the granular structure after firing processes have been completed. Restructuring of the granular structure in the layer 7, occurs as a result of the high temperature processes completed, after deposit of the layer 7. The high temperature processes form one or more voids 18 in the layer 7, as described, for example, at the Electrochemical Society Meeting, in "Extended Abstracts #569", entitled "A Failure Mechanism In Silicon Gate Structure" by M. Revitz and J. F. Shepard, pages 1427–1428, on Oct. 14–19, 1979, at Los Angeles, CA. Briefly, the study described in the abstract indicates that voids in polysilicon originate from two sources. The first source is caused by photolithography, where mask defects or pinholes in resist can produce a hole in the polysilicon. Thus, if the polysilicon land is used as a stop in etching underlying silicon dioxide, attack of the underlying silicon dioxide can occur. The second source is caused by grain growth in polysilicon as a result of hot processing steps. It can be shown that the grain size of intrinsically deposited polysilicon is of the order of 30–50 nanometers. After a diffusion sequence ($POCl_3$) and several oxidation steps, the grain size of polysilicon is of the order of 300 to 500 nanometers. Polysilicon films of such grain size over silicon dioxide permit significant attack to the silicon dioxide when the polysilicon is exposed to buffered hydrofluoric acid. The study further determined that the relative contribution of defects in the silicon dioxide produced by grain growth and photolithography defects were that, although a significant number of failures obtained were due to photolithography, the majority of defects in the silicon dioxide were due to large grain polysilicon, or grain boundary voids.

As can be seen from FIG. 1, an etchant (not shown) is employed to form a contact opening 16 in the layer 8, after completion of one or more hot processes and suitable masking of the layer 8. The etchant will pass through the polysilicon void 18 shown in B and form an etched opening 20 in the layer 4 because it is of the same material as the layer 8. Subsequently, when a contact metal (not shown) is apropriately formed in the opening 16, the metal will also pass through the void 18 and the layer 7 to physically and electrically join the layers 3 and 7.

Figure 2:
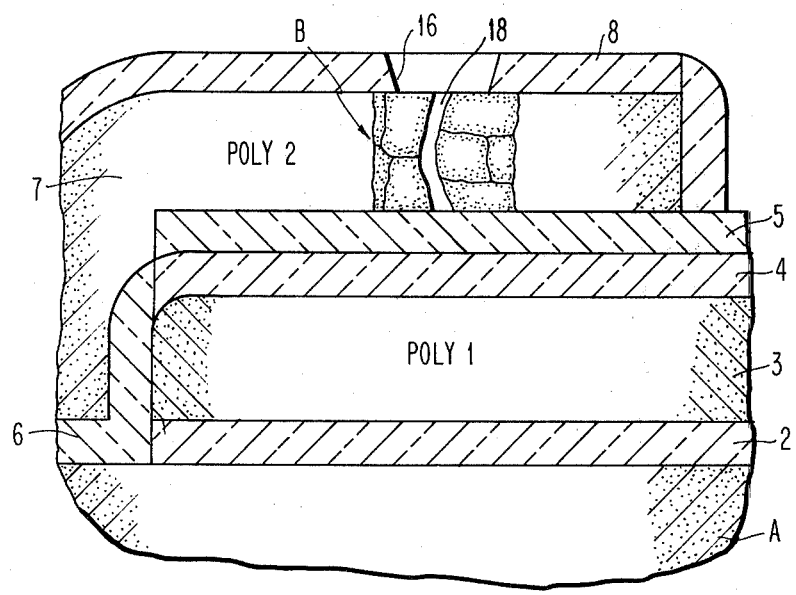
FIG. 2 is a cross-sectional view of an improved contact structure for a double polysilicon semiconductor device incorporating the principles of the present invention.

The present invention, as shown in FIG. 2, overcomes the shorting problems between overlying polysilicon conductors in prior art devices. In FIG. 2, like elements to those in FIG. 1 have the same reference characters.

The structure shown in FIG. 2 is essentially the same as that shown in FIG. 1 except that a dielectric material 5 is deposited on the layer 4 and patterned to be aligned with the first polysilicon layer 3. The dielectric layer 5 is of a different composition than that for the insulating layers 4 and 8. In one form, the dielectric material 5 may be silicon nitride. In another form, the dielectric material 5 may be aluminum oxide. In any case, however, the dielectric material 5 should be insensitive to the etchant forming the opening 16 in the layer 8. The dielectric 5, as an etch stop, prevents the formation of the opening 20 (see FIG. 1) in the layer 4. Since the opening 20 (see FIG. 1) has not been formed in the layer 4 of FIG. 2, then the contact metal (not shown) in the opening 16 and void 18 will not create a physical and electrical connection between the layers 3 and 7.

FIG. 2, therefore, does not require that contact structures in double poly devices be relocated in chip areas where the layer 7 does not overly the layer 3 thereby reducing the space available for the formation of active devices in a semiconductor chip. The alignment of the etch stop or layer 5 with the contact opening 16 limits the effect of the etch stop material in fabricating other portions of the device. Also, the limited placement of the dielectric minimizes operational effects of the dielectric relative to the active devices in the chip. That is to say, in the case of silicon nitride, there is a tendency for the nitride to store a charge and create increased capacitor effects in the device. Limiting the silicon nitride layer 5 to the contact openings, reduces the capacitive effect on the device performance.

Turning to FIGS. 3–9, a process is described for forming double polysilicon layers, having an improved contact structure which overcomes the polysilicon void phenomenon in permitting the contact metal to short the conductors together.

Figure 3:
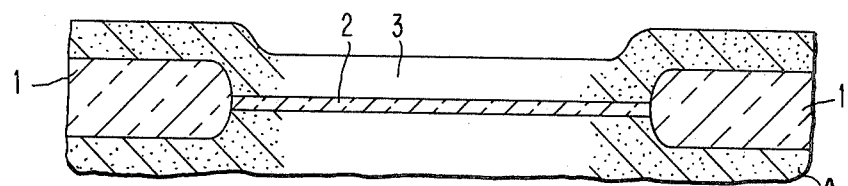
FIGS. 3–9 is a series of process steps in forming an improved contact structure for a double polysilicon semiconductor device of the type shown in FIG. 2.

In FIG. 3, substrate A is suitably processed, as described, for example, in U.S. patent application Ser. No. 957,606, filed Nov. 3, 1978, entitled "Method of Forming An Insulator Between Layers of Conductive Material", granted as U.S. Pat. No. 4,234,362 on Nov. 18, 1980 to J. Riseman, and assigned to the same assignee as that of the present invention. A recessed dielectric region 1, typically silicon dioxide, is formed in the substrate and has a thickness of approximately 5 to 7,000 Å. A first insulating layer 2, typically silicon dioxide, having a thickness of 3 to 700 Å and a doped polysilicon layer 3 having a thickness of approximately 3 to 5,000 Å overlie the substrate and region 1. The polysilicon layer 3 is suitably doped with phosphorus oxychloride ($POCl_3$) to achieve a resistivity of approximately 20 to 40 ohms per square.

Figure 4:
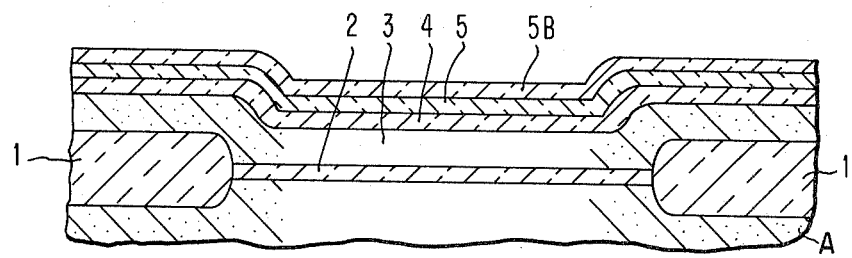

In FIG. 4, a layer 4 of chemically vapor deposited silicon dioxide is formed across the layer 3. The layer 4 is formed to a thickness of approximately 1,000 to 4,000 Å. An etch stop layer 5 is formed on the layer 4. In one form, the layer is silicon nitride formed to a thickness of 200 to 1,000 Å. The layer 5 is covered by masking layer of 5B which is chemically vapor deposited silicon dioxide having a thickness of 1,000 to 2,000 Å. The details of forming the layers 4 and 5 are also described in the above-mentioned U.S Pat. No. 4,234,362.

Figure 5:
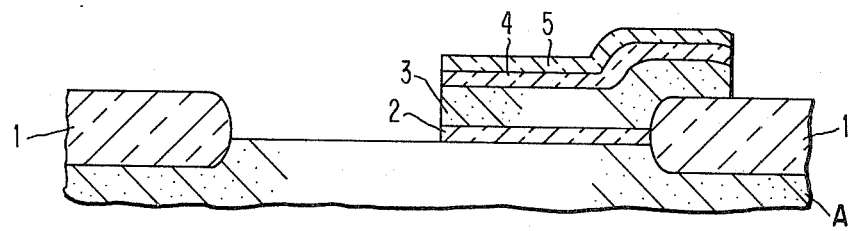

Turning to FIG. 5, the first polysilicon conductor 3 can be defined by conventional photolithography techniques. The layers 2, 3, 4 and 5 can be successively etched by conventional solutions and photolithographic processes well known in the art. The layer 5 is selectively patterned on the layers 3 and 4 to duplicate the contact pattern to be formed in a subsequent and overlying polysilicon conductor (not shown).

Figure 6:
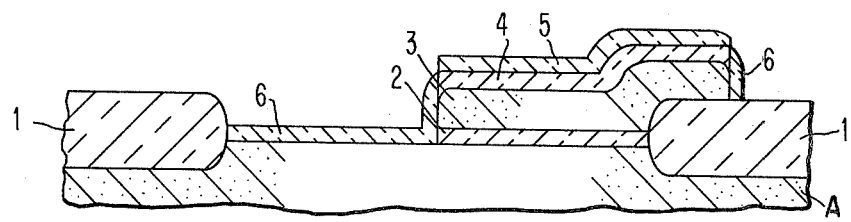

In FIG. 6, the exposed sidewall of the conductor 3 and exposed surface of the substrate A are insulated by growing a silicon dioxide layer 6 to a thickness of 500 to 1,000 Å in an oxygen ambient as is well known in the art. The layer 6 unites with the layers 4 and 2 to enclose the layer 3 in insulation, as well as protect the exposed surface of the substrate A.

Figure 7:
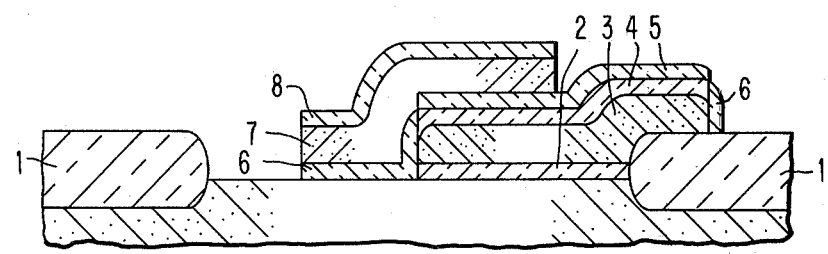

In FIG. 7, a second polysilicon layer 7 and insulating layer 8 are formed on the layers 6 and 5. Both the layers 7 and 8 are patterned by conventional processes about the layer 5 which serves as an etch stop as will be subsequently described. The layer 7 is deposited to a thickness of approximately 3 to 5,000 Å and suitably doped in the manner similar to that described for the layer 3. A chemically vapor deposited silicon dioxide is employed to form the layer 8. Alternatively, the layer 7 may be thermally oxidized to form the layer 8 to a thickness of 1,000 to 2,000 Å. The surface of substrate A is exposed during the patterning of the layers 7 and 8.

Figure 8:
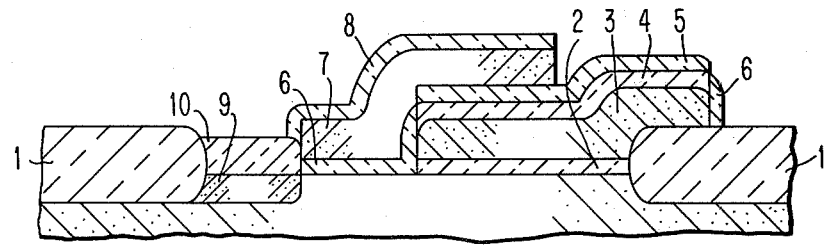

In FIG. 8, a source/drain region 9 is formed in the exposed surface of the substrate A. An N+ diffusion region 9 is formed in the substrate by conventional processes. The region 9 is typically formed to a depth of approximately 0.5 to 1.5 microns. The diffused region is covered by a thermal or like silicon dioxide layer 10. The thickness of layer 10 is typically 2500 to 3500 Å.

Figure 9:
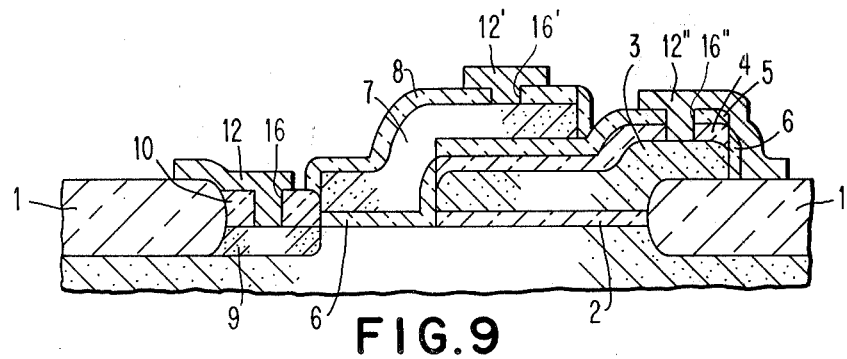

In FIG. 9, contact openings 16, 16' and 16" are formed in the layers 10, 8, 4 and 5 by conventional photolithographic processes and etching solutions. In the case of the opening 16", the silicon nitride layer 5 is removed by using a selective etch such as phosphoric acid ($H_3PO_4$). In forming the contact opening 16', the layer 5 which is aligned therewith serves as an etch stop to the etching solution, as previously described. Accordingly, when a layer of metal (not shown) is formed across the surface of the device and in the contact openings, there will not be any physical and electrical connection between the layers 3 and 7, as in the prior art. The metal layer (not shown) is appropriately patterned to form the contacts 12, 12' and 12" to interconnect the conductors in the prescribed circuit pattern for the device.

While the invention has been particularly shown and described with reference to a preferred embodiment thereof, it will be understood by those skilled in the art that the foregoing and other changes inform and detail may be made therein without departing from the spirit and scope of the invention.

We claim:

1. A process for fabricating a contact structure for a semiconductor device including at least two superimposed polysilicon conductors comprising the steps of:

A. forming a first insulating layer 2 (FIG. 3) on a semiconductor substrate A to a preselected thickness, said insulating layer 2 being formed of silicon dioxide and having a thickness in the order of 300 to 700 Å, B. forming a first conductive polysilicon layer 3 (FIG. 3) on the first insulating layer 2, said polysilicon layer 3 having a thickness in the order of 3000 Å to 5000 Å, C. forming a first dielectric layer 4 (FIG. 4) on the first conductive polysilicon layer 3, said first dielectric layer 4 being formed of silicon dioxide and having a thickness in the order of 1000 A to 4000 A, D. patterning the first insulating 2 and dielectric 4 and conductive polysilicon layers 3 into a preselected shape (FIG. 5), E. patterning a second dielectric layer 5 (FIG. 5) on the first dielectric layer as an etch barrier to selected etchants, said second dielectric layer 5 being selected from the group consisting of silicon nitride and aluminum oxide, said second dielectric layer 5 having a thickness in the order of 200 to 1000 Å, F. forming a second conductive polysilicon layer 7 (FIG. 7) on the second dielectric layer 5 and superimposed, in part at least, on the first conductive polysilicon layer 3, said second polysilicon layer 7 having a thickness in the order of 3000 to 5000 Å, G. forming a third dielectric layer 8 (FIG. 7) on the second conductive polysilicon layer 7, said third dielectric layer 8 being formed of silicon dioxide and having a thickness in the order of 1000 to 2000 Å, H. etching a contact opening 16' (FIG. 9) in the third dielectric 8 to expose the second conductive polysilicon layer 7 overlying the first conductive polysilicon layer 3 whereby the second dielectric layer 5 prevents the etchant from exposing the first conductive polysilicon layer 3 by way of voids existing in the second conductive polysilicon layer 7 due to enlarged polysilicon grains, and I. forming a metal contact 12' in the opening 16' (FIG. 9), whereby the second dielectric layer 5 prevents the etchant from attacking the first dielectric layer 4 overlying the first conductive polysilicon layer 3 and exposing the surface of the first polysilicon layer 3 to the metal 12 thereby physically joining together the first and second conductive polysilicon layers 3, 7.

* * * * *